(12) United States Patent
Lee et al.

(10) Patent No.: US 11,791,137 B2
(45) Date of Patent: Oct. 17, 2023

(54) APPARATUS FOR ETCHING SUBSTRATE BEVEL AND SEMICONDUCTOR FABRICATION METHOD USING THE SAME

(71) Applicant: Samsung Electronics Co., Ltd., Suwon-si (KR)

(72) Inventors: Hakseung Lee, Seoul (KR); Ho-Jin Lee, Hwaseong-si (KR); Dong-Chan Lim, Hwaseong-si (KR); Jinnam Kim, Anyang-si (KR); Kwangjin Moon, Hwaseong-si (KR)

(73) Assignee: Samsung Electronics Co., Ltd.

( * ) Notice: Subject to any disclaimer, the term of this patent is extended or adjusted under 35 U.S.C. 154(b) by 553 days.

(21) Appl. No.: 16/855,048

(22) Filed: Apr. 22, 2020

(65) Prior Publication Data

US 2021/0066386 A1 Mar. 4, 2021

(30) Foreign Application Priority Data

Aug. 27, 2019 (KR) .................. 10-2019-0104939

(51) Int. Cl.
*H01J 37/32* (2006.01)
*H01L 21/67* (2006.01)

(52) U.S. Cl.
CPC .. *H01J 37/32642* (2013.01); *H01J 37/32715* (2013.01); *H01L 21/67069* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 7,943,007 B2 * | 5/2011 | Bailey, III | .......... H01L 21/0209 156/345.47 |
| 8,062,982 B2 | 11/2011 | Fischer et al. | |
| 8,349,126 B2 | 1/2013 | Chang et al. | |
| 8,419,964 B2 | 4/2013 | Ganesan et al. | |
| 8,562,266 B2 | 10/2013 | Sexton | |
| 9,623,516 B2 | 4/2017 | Kondo | |
| 2004/0137745 A1 | 7/2004 | Houghton et al. | |
| 2004/0238488 A1 | 12/2004 | Choi et al. | |
| 2010/0212833 A1 * | 8/2010 | Chang | ............... H01J 37/32642 156/345.43 |
| 2020/0020524 A1 * | 1/2020 | Chang | ............... H01L 21/02238 |
| 2021/0351018 A1 * | 11/2021 | Kim | ................... H01J 37/32642 |

FOREIGN PATENT DOCUMENTS

KR 1020090044571 5/2009

* cited by examiner

*Primary Examiner* — Ram N Kackar
(74) *Attorney, Agent, or Firm* — Myers Bigel, P.A.

(57) ABSTRACT

A bevel etching apparatus includes a chuck plate that is configured to receive a substrate, a lower ring surrounding a circumference of the chuck plate, a cover plate on the chuck plate, and an upper ring surrounding a circumference of the cover plate. The lower ring includes a ring base and a protrusion that extends upwardly from an edge of the ring base and surrounds a lower portion of a sidewall of the substrate.

15 Claims, 6 Drawing Sheets

APPARATUS FOR ETCHING SUBSTRATE BEVEL AND SEMICONDUCTOR FABRICATION METHOD USING THE SAME

CROSS-REFERENCE TO RELATED APPLICATION

This U.S. non-provisional application claims priority under 35 U.S.C § 119 to Korean Patent Application No. 10-2019-0104939, filed on Aug. 27, 2019, in the Korean Intellectual Property Office, the disclosure of which is hereby incorporated by reference in its entirety.

BACKGROUND

The present inventive concepts relate to an apparatus for and method of fabricating a semiconductor device, and more particularly, to an apparatus for etching a substrate bevel and a semiconductor fabrication method using the same.

In semiconductor devices and electronic products using the same, high capacity, thinness, and compact size have been in increasing demand and thus various new package techniques have been suggested. For example, semiconductor devices may include application processors, memory devices, and image sensors. Package technology may integrate an application processor, a memory device, and an image sensor into a single chip.

SUMMARY

Some example embodiments of the present inventive concepts provide a bevel etching apparatus capable of reducing or preventing plasma-induced damage to a substrate bottom surface.

Some example embodiments of the present inventive concepts provide a method of fabricating a semiconductor device, which method can reduce defects of a substrate edge.

According to some example embodiments of the present inventive concepts, a bevel etching apparatus may comprise: a chuck plate configured to receive a substrate; a lower ring surrounding a circumference of the chuck plate; a cover plate on the chuck plate; and an upper ring surrounding a circumference of the cover plate. The lower ring may include: a ring base; and a protrusion extending upwardly from an edge of the ring base to surround a lower portion of a sidewall of the substrate.

According to some example embodiments of the present inventive concepts, a bevel etching apparatus may comprise: a chamber; a chuck plate in the chamber, the chuck plate configured to receive a substrate; a lower ring surrounding a circumference of the chuck plate, the lower ring including an outer wall that surrounds a lower portion of a side of the substrate; a cover plate on the chuck plate; an upper ring surrounding a circumference of the cover plate and on the lower ring; and a bias electrode adjacent the upper and lower rings.

According to some example embodiments of the present inventive concepts, a semiconductor fabrication method may comprise: forming a first semiconductor device on a first substrate; forming a second semiconductor device on a second substrate; etching an upper corner of the second substrate to form a stepped groove, the upper corner being radially spaced apart from the second semiconductor device; and bonding the second semiconductor device to the first semiconductor device.

DETAILED DESCRIPTION OF EMBODIMENTS

Figure 1:
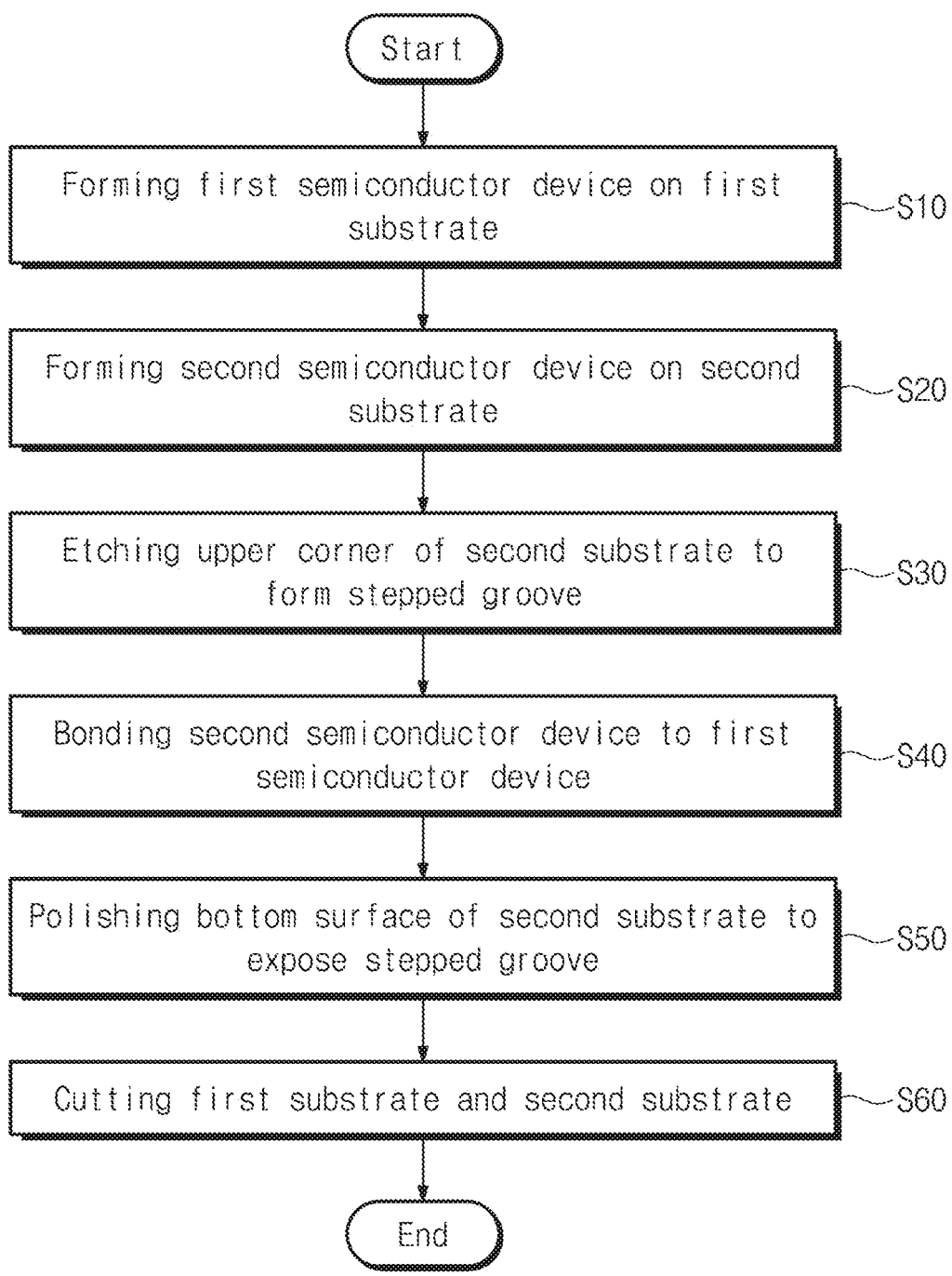
FIG. 1 illustrates a flow chart showing an example of a semiconductor fabrication method according to the present inventive concepts.

FIG. 1 shows an example of a semiconductor device fabrication method according to the present inventive concepts. FIGS. 2 to 7 illustrate cross-sectional views showing the semiconductor fabrication method of FIG. 1.

Figure 2:
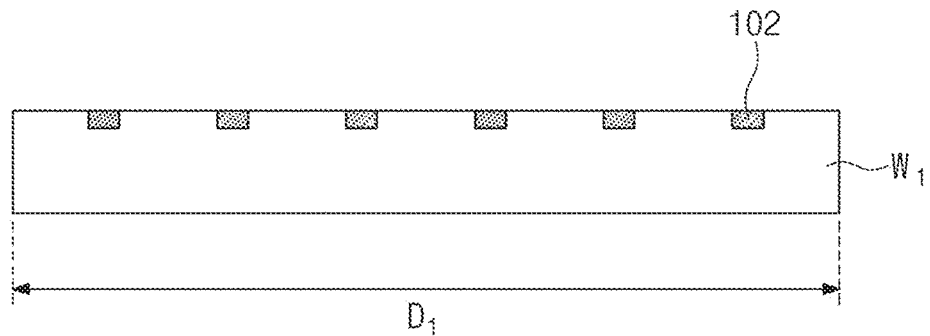
FIGS. 2 to 7 illustrate cross-sectional views showing the semiconductor fabrication method of FIG. 1.

Referring to FIGS. 1 and 2, a first fabrication facility may form a first semiconductor device 102 on a first substrate $W_1$ (S10). The first fabrication facility may include a film deposition apparatus, a photolithography apparatus, and an etching apparatus, but the present inventive concepts are not limited thereto. For example, the first substrate $W_1$ may include a silicon wafer. The first wafer $W_1$ may have a first diameter D1 of about 300 mm, but the present inventive concepts are not limited thereto. The first semiconductor device 102 may be formed on a top surface of the first substrate $W_1$. For example, the first semiconductor device 102 may be a memory device. The first semiconductor device 102 may include, for example, a DRAM device or a NAND Flash memory device. Alternatively, the first semiconductor device 102 may include an application processor, but the present inventive concepts are not limited thereto.

Figure 3:
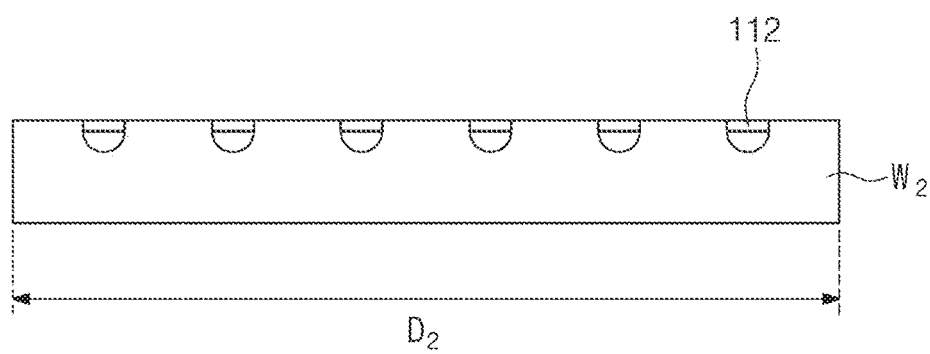

Referring to FIGS. 1 and 3, a second fabrication facility may form a second semiconductor device 112 on a second substrate $W_2$ (S20). The second fabrication facility may be the same as the first fabrication facility. In addition, the second substrate $W_2$ may be the same as the first substrate $W_1$. For example, the second substrate $W_2$ may include a silicon wafer. The second substrate $W_2$ may have a second diameter $D_2$ of about 300 mm. The second semiconductor device 112 may be formed on a top surface of the second substrate $W_2$. For example, the second semiconductor device 112 may include an image sensor.

Figure 8:
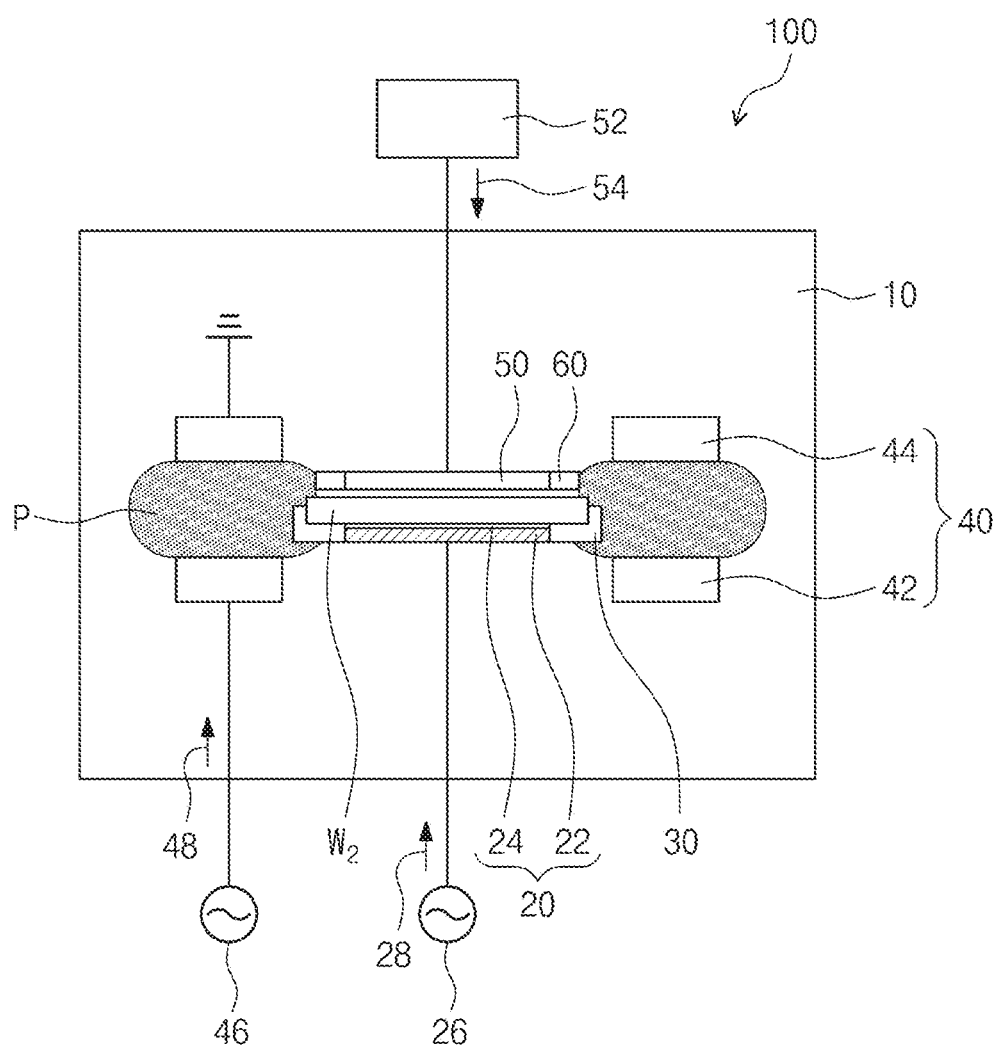
FIG. 8 illustrates a cross-sectional view showing a bevel etching apparatus that etches an upper corner of a second substrate depicted in FIG. 3.

FIG. 8 shows an example of a bevel etching apparatus 100 that etches an upper corner of the second substrate $W_2$ depicted in FIG. 3. As used herein, the term "upper corner" may mean the portion or region bounded by an edge of a top surface of the second substrate $W_2$ and an upper portion of a sidewall or side surface of the second substrate $W_2$. The upper corner may extend around the entire circumference of the second substrate $W_2$.

Figure 4:
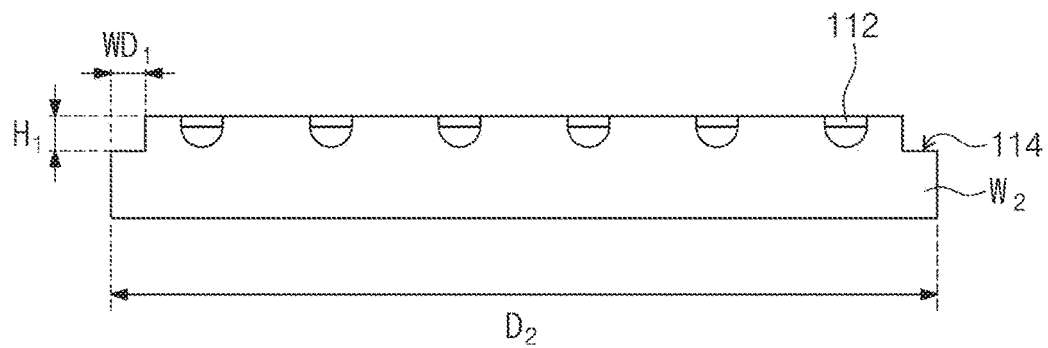
Figure 5:
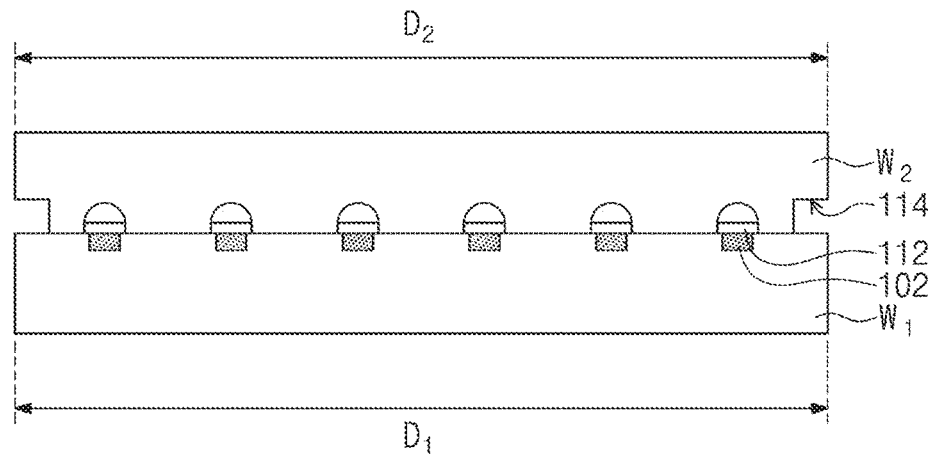

Referring to FIGS. 1, 4, and 8, the bevel etching apparatus 100 may etch or trim the upper corner of the second substrate $W_2$ to form a stepped groove 114 (S30). The bevel etching apparatus 100 may locally provide the upper corner of the second substrate $W_2$ with plasma P to form the stepped groove 114. The stepped groove 114 may be formed to have an L shape or an L-shaped cross section. For example, the stepped groove 114 may have a first width $WD_1$ of about 0.5 mm to about 3 mm and a first height $H_1$ of about 3 μm to about 30 μm.

Referring to FIG. 8, the bevel etching apparatus 100 may include a chamber 10, a chuck plate 20, a lower plasma exclusion zone (PEZ) ring 30, a bias electrode 40, a cover plate 50, and an upper PEZ ring 60.

The chamber 10 may provide the second substrate $W_2$ with a hermetic seal or space from the outside. The chamber 10 may have a vacuum pressure less than atmospheric pressure.

The chuck plate 20 may be disposed in the chamber 10. The chuck plate 20 may receive the second substrate $W_2$. The chuck plate 20 may support a center of the second substrate $W_2$. For example, the chuck plate 20 may include a chuck base 22 and a dielectric layer 24. The chuck base 22 may include an aluminum alloy. The dielectric layer 24 may be placed on the chuck base 22. The dielectric layer 24 may include aluminum oxide ($Al_2O_3$), but the present inventive concepts are not limited thereto.

A source power supply 26 may be provided outside the chamber 10. The source power supply 26 may be connected to the chuck base 22, thereby supplying a source power 28. The chuck base 22 may use the source power 28 to create the plasma P on an edge of the second substrate $W_2$. For example, the source power 28 may have a frequency of about 13.56 MHz.

Figure 9:
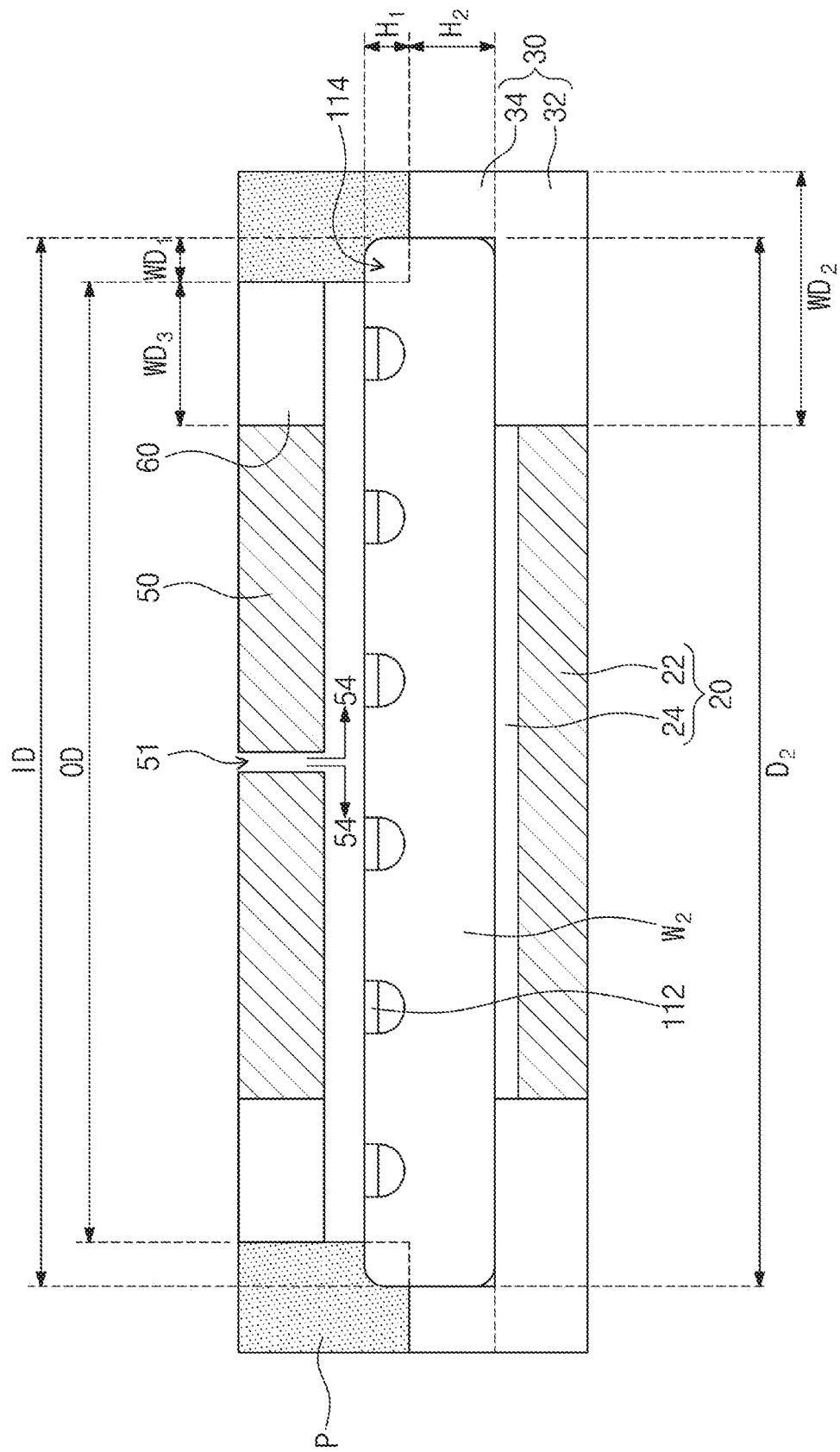
FIG. 9 illustrates a cross-sectional view showing an example of a chuck plate, a lower plasma exclusion zone (PEZ) ring, a cover plate, and an upper PEZ ring depicted in FIG. 8.

FIG. 9 shows an example of the chuck plate 20, the lower PEZ ring 30, the cover plate 50, and the upper PEZ ring 60 depicted in FIG. 8.

Referring to FIG. 9, the chuck plate 20, the lower PEZ ring 30, the cover plate 50, and the upper PEZ ring 60 may restrictedly and/or selectively expose the upper corner of the second substrate $W_2$ to the plasma P. The lower PEZ ring 30 may be disposed around or surround a side of the chuck plate 20 and may support the edge or an edge of a bottom surface of the second substrate $W_2$. The cover plate 50 may cover the center of the second substrate $W_2$. The upper PEZ ring 60 may be disposed around or surround the cover plate 50 and may partially cover or be disposed above the edge of the second substrate $W_2$.

The following will describe in detail the lower PEZ ring 30, the cover plate 50, and the upper PEZ ring 60.

The lower PEZ ring 30 may be disposed on or surround a sidewall or side of the chuck plate 20 and/or on a circumference of the chuck plate 20. The lower PEZ ring 30 may include, for example, a ceramic of $Al_2O_3$ or $Y_2O_3$. The lower PEZ ring 30 may have an L shape or an L-shaped cross-section. The lower PEZ ring 30 may surround a lower corner of the second substrate $W_2$. For example, the lower PEZ ring 30 may surround an edge of a bottom surface of the second substrate $W_2$ and a lower portion of a sidewall or side surface of the second substrate $W_2$. The lower PEZ ring 30 may prevent the plasma P from contacting a bottom surface of the edge of the second substrate $W_2$ and the lower corner of the second substrate $W_2$.

Figure 10:
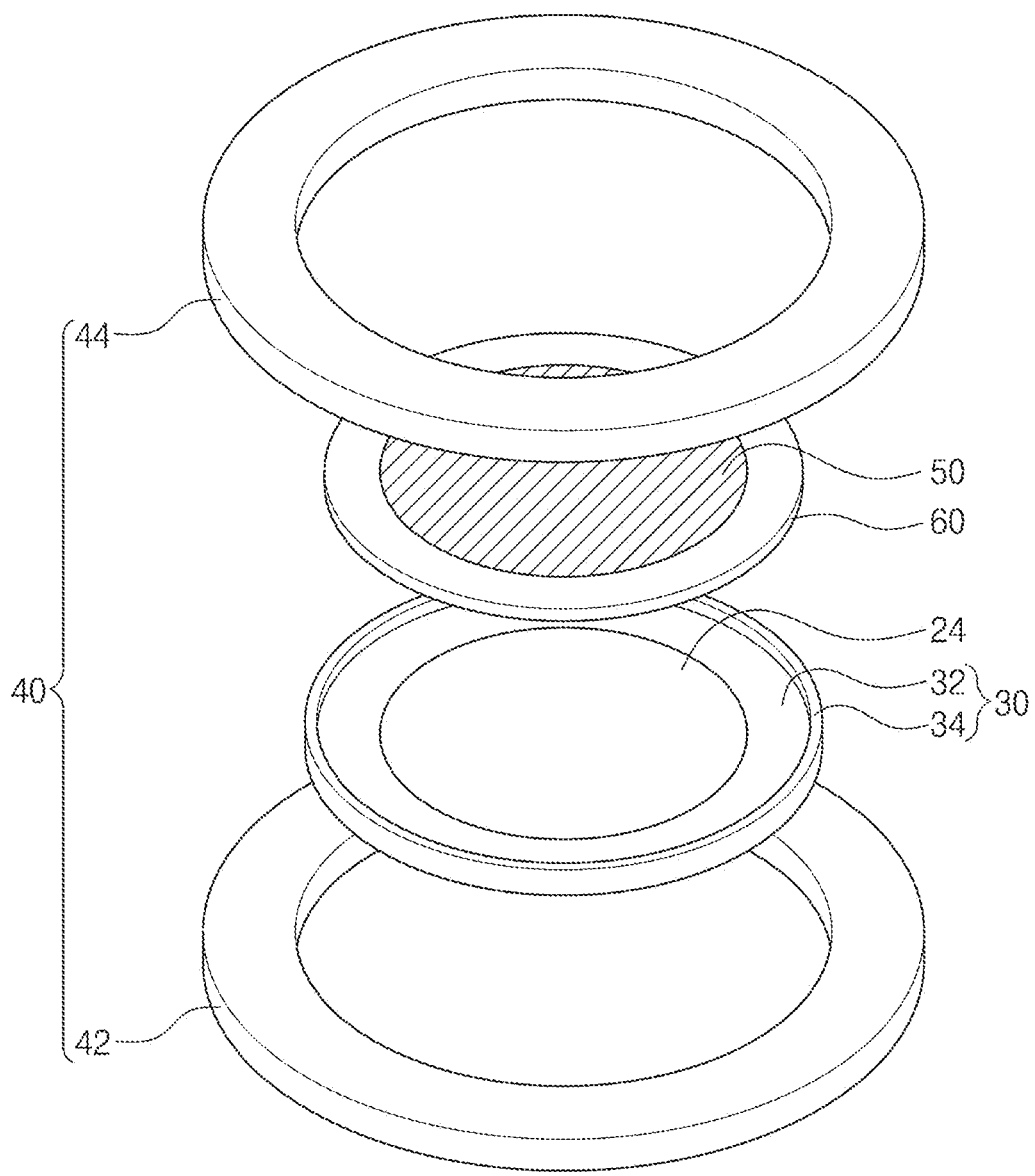
FIG. 10 illustrates a perspective view showing an example of the lower PEZ ring depicted in FIG. 9.

FIG. 10 shows an example of the lower PEZ ring 30 depicted in FIG. 9.

Referring to FIGS. 9 and 10, the lower PEZ ring 30 may include a ring base 32 and a protrusion or outer wall 34.

The ring base 32 may support the edge of the second substrate $W_2$. The ring base 32 may have a top or upper surface coplanar with that of the dielectric layer 24 of the chuck plate 20. The ring base 32 may have a second width $WD_2$ of about 10 mm to about 50 mm.

The protrusion 34 may be disposed on an edge (e.g., outermost edge) of the ring base 32 and may extend upwardly from the ring base 32 (e.g., perpendicular to the top surface of the ring base). The protrusion 34 may extend in a sidewall direction of the upper PEZ ring 60 (e.g., parallel to a side or sidewall of the upper PEZ ring 60). The protrusion 34 may surround a lower portion of a sidewall and/or the lower corner of the second substrate $W_2$ and may expose the upper corner or an upper portion of the sidewall of the substrate $W_2$ to the plasma P. The protrusion 34 may prevent the bottom surface and the lower corner of the second substrate $W_2$ from being damaged due to the plasma P. The protrusion 34 may have an inner diameter ID the same as the second diameter $D_2$ of the second substrate $W_2$. When the second diameter $D_2$ of the second substrate $W_2$ is about 300 mm, the inner diameter ID of the protrusion 34 may be about 300 mm. When the second substrate $W_2$ has a thickness of about 775 μm, the protrusion 34 may have a second height $H_2$ of about 745 μm to about 772 μm from the top surface of the ring base 32. The protrusion 34 may expose the upper corner or the upper portion of the sidewall of the second substrate $W_2$ to the plasma P along the first height $H_1$ of about 3 μm to about 30 μm. The plasma P may partially etch the upper corner of the second substrate $W_2$, thereby forming the stepped groove 114. The plasma P may etch an edge of a top surface of the second substrate $W_2$ and the upper portion of a sidewall of the second substrate $W_2$ to thereby form the stepped groove 114.

Referring to FIGS. 8 and 10, the bias electrode 40 may be disposed outside or radially away from the lower PEZ ring 30 and the upper PEZ ring 60 in the chamber 10. For example, the bias electrode 40 may be disposed adjacent to corners of the lower PEZ ring 30 and/or the upper PEZ ring 60. The bias electrode 40 may have an annular or ring shape. The bias electrode 40 may concentrate the plasma P on the upper corner of the second substrate $W_2$. The bias electrode 40 may include, for example, a lower electrode 42 and an upper electrode 44.

The lower electrode 42 may be placed below the lower PEZ ring 30. The plasma P may be accommodated between the lower electrode 42 and the upper electrode 44. The lower electrode 42 may be connected to a bias power supply 46. The bias power supply 46 may supply the lower electrode 42 with a bias power 48. The lower electrode 42 may use the bias power 48 to concentrate the plasma P on the upper corner of the second substrate $W_2$. The bias power 48 may have a frequency of about 2 MHz to about 60 MHz. Alternatively, the lower electrode 42 may be electrically grounded, but the present inventive concepts are not limited thereto.

The upper electrode 44 may be disposed above the lower electrode 42. The upper electrode 44 may be placed above the upper PEZ ring 60. The upper electrode 44 may be electrically grounded. Alternatively, the upper electrode 44 may be connected to the bias power supply 46. The upper electrode 44 may use the bias power 48 to concentrate the plasma P on the upper corner of the second substrate $W_2$.

Referring to FIGS. 8 to 10, the cover plate 50 may be disposed on or above the chuck plate 20 in the chamber 10. The cover plate 50 may overlap the chuck plate 20. The cover plate 50 and the chuck plate 20 may have the same diameter or substantially the same diameter. For example, the cover plate 50 may include quartz. For another example, the cover plate 50 may include a ceramic of $Al_2O_3$ or $Y_2O_3$, but the present inventive concepts are not limited thereto.

A gas supply 52 may be connected to the cover plate 50. The gas supply 52 may supply the cover plate 50 with a reaction gas 54. For example, the cover plate 50 may have a hole or channel 51 defined therein. The reaction gas 54 may be provided through the hole 51 to the top surface of the second substrate $W_2$. The reaction gas 54 may flow along the top surface of the second substrate $W_2$ and may be provided into the plasma P outside the upper PEZ ring 60. For example, the cover plate 50 may be spaced apart at about 1 mm or less from the second substrate $W_2$. Because a bottom surface of the cover plate 50 and the top surface of the second substrate $W_2$ are spaced apart at an interval less than a sheath width of the plasma P, the plasma P may not be created between the cover plate 50 and the second substrate $W_2$. The reaction gas 54 may activate an etching reaction of the upper corner of the second substrate $W_2$. The reaction gas 54 may be an etching gas. For example, the reaction gas 54 may include $SF_6$, $CF_4$, HF, or $NF_3$.

The upper PEZ ring 60 may be disposed on a lateral or side surface and/or a circumference of the cover plate 50. The upper PEZ ring 60 may have a bottom surface coplanar with that of the cover plate 50. The upper PEZ ring 60 may include, for example, a ceramic of $Al_2O_3$ or $Y_2O_3$. The upper PEZ ring 60 may cover or be disposed above the edge of the second substrate $W_2$. Because the bottom surface of the upper PEZ ring 60 and the top surface of the second substrate $W_2$ are spaced apart at an interval less than a sheath width of the plasma P, the plasma P may not be created between the upper PEZ ring 60 and the second substrate $W_2$.

The upper PEZ ring 60 may be thicker than the lower PEZ ring 30. The upper PEZ ring 60 may have a third width $WD_3$ less than the second width $WD_2$ of the lower PEZ ring 30. The upper PEZ ring 60 may have an outer diameter OD less than the inner diameter ID of the protrusion 34. For example, the protrusion 34 may have the inner diameter ID greater than the outer diameter OD of the upper PEZ ring 60. The outer diameter OD of the upper PEZ ring 60 may range, for example, from about 294 mm to about 299 mm. The upper PEZ ring 60 may expose the upper corner of the second substrate $W_2$ to the plasma P. The exposed upper corner of the second substrate $W_2$ may have the first width $WD_1$ of about 0.5 mm to about 3 mm. The upper PEZ ring 60 may expose an edge of a top surface of the second substrate $W_2$.

Referring back to FIGS. 1 and 5, a bonding apparatus may bond the second semiconductor device 112 to the first semiconductor device 102 (S40). For example, the step S40 of bonding the second semiconductor device 112 to the first semiconductor device 102 may include a wafer-to-wafer bonding method. The top surface of the second substrate $W_2$ may be bonded to the top surface of the first substrate $W_1$. Although not shown, a pad of the first semiconductor device 102 may be bonded to a pad of the second semiconductor device 112.

Figure 6:
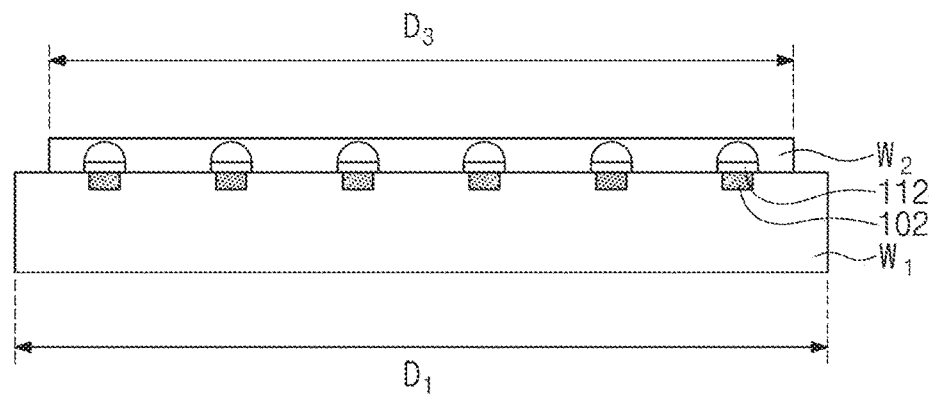

Referring to FIGS. 1 and 6, a polishing apparatus may polish the bottom surface of the second substrate $W_2$ to expose the stepped groove 114 (S50). For example, a bottom surface of the stepped groove 114 may be removed to expose a sidewall or vertical sidewall of the stepped groove 114. The step S50 of polishing the bottom surface of the second substrate $W_2$ may be, for example, a back lap process or a back grind process on the second substrate $W_2$. The second substrate $W_2$ may be polished to have the first height $H_1$ of about 3 μm to about 30 μm. When the stepped groove 114 is exposed, the second substrate $W_2$ may have a third diameter $D_3$ of about 294 mm to about 299 mm. The stepped groove 114 may reduce crack debris or particle defects of the second substrate $W_2$ that are produced during the polishing process on the bottom surface of the second substrate $W_2$. When the stepped groove 114 is absent, a bevel of the upper corner of the second substrate $W_2$ may create crack debris or particles during the polishing process.

Figure 7:
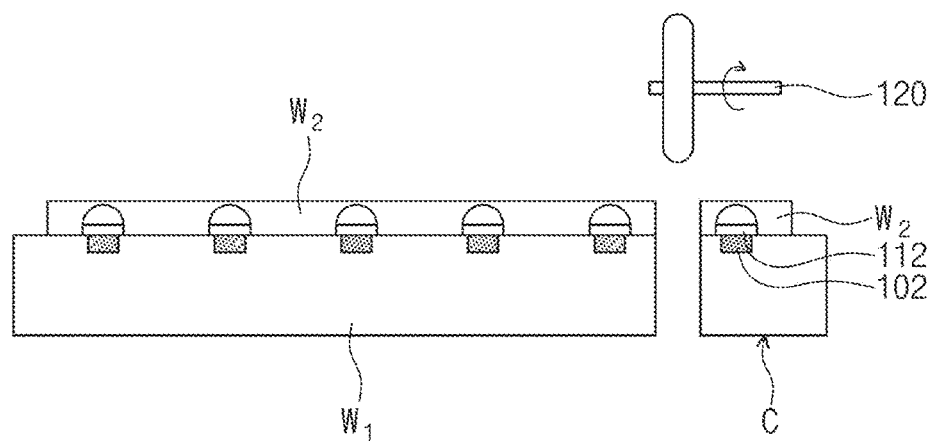

Referring to FIGS. 1 and 7, a cutting apparatus 120 may cut the first and second substrates $W_1$ and $W_2$ along or adjacent the first and second semiconductor devices 102 and 112, with the result that a semiconductor chip C may be separated from the first and second substrates $W_1$ and $W_2$ (S60). The cutting apparatus 120 may include a sawing apparatus and/or a laser cutting apparatus. The semiconductor chip C may have a bonding structure or a stacking structure of the first and second semiconductor devices 102 and 112.

As discussed above, a bevel etching apparatus according to some example embodiments of the present inventive concepts may use a lower PEZ ring having a protrusion that surrounds a lower corner of a substrate, and thus may prevent damage to a bottom surface of the substrate. Furthermore, a semiconductor fabrication method according to some example embodiments of the present inventive concepts may etch an upper corner of the substrate to form a stepped groove, and may use the stepped groove to reduce edge defects of the substrate when the bottom surface of the substrate is polished.

Although the present inventive concepts have been described in connection with the embodiments of the present inventive concepts illustrated in the accompanying drawings, it will be understood to those skilled in the art that various changes and modifications may be made without departing from the scope of the present inventive concepts. It therefore will be understood that the embodiments described above are just illustrative but not limitative in all aspects. The inventive concepts are defined by the following claims, with equivalents of the claims to be included therein.

What is claimed is:

1. A bevel etching apparatus, comprising:
a chuck plate configured to receive a substrate;
a lower ring surrounding a circumference of the chuck plate;
a cover plate on the chuck plate; and
an upper ring surrounding a circumference of the cover plate,
wherein the lower ring includes:
a ring base having constant thickness and configured to support an edge of a bottom surface of the substrate; and
a protrusion extending upwardly from an edge of the ring base to surround a lower portion of a sidewall of the substrate,
wherein the protrusion has an inner diameter greater than an outer diameter of the upper ring,
wherein the protrusion has a height of 745 μm to 772 μm from a top surface of the ring base,
wherein the bevel etching apparatus further comprises a bias electrode comprising a lower electrode and an upper electrode,
wherein an upper surface of the lower electrode is below and spaced apart from the lower ring, and
wherein a lower surface of the upper electrode is above and spaced apart from the lower electrode and the upper ring.

2. The bevel etching apparatus of claim 1, wherein the inner diameter of the protrusion is 300 mm, and the outer diameter of the upper ring is 294 mm to 299 mm.

3. The bevel etching apparatus of claim 1, wherein a top surface of the ring base is entirely coplanar with the top surface of the chuck plate.

4. The bevel etching apparatus of claim 1, wherein the cover plate is above the chuck plate and the cover plate has a diameter that is substantially the same as a diameter of the chuck plate.

5. The bevel etching apparatus of claim 4, wherein the ring base has a width greater than a width of the upper ring.

6. The bevel etching apparatus of claim 1, wherein the upper ring is thicker than the lower ring.

7. The bevel etching apparatus of claim 1, wherein a bottom surface of the upper ring is coplanar with a bottom surface of the cover plate.

8. The bevel etching apparatus of claim 1, wherein the upper ring and the lower ring expose an upper corner of the substrate.

9. The bevel etching apparatus of claim 1, wherein the ring base comprises planar top and bottom surfaces.

10. A bevel etching apparatus, comprising:
a chamber;
a chuck plate in the chamber, the chuck plate configured to receive a substrate;
a lower ring surrounding a circumference of the chuck plate;
a cover plate on the chuck plate;
an upper ring surrounding a circumference of the cover plate and on the lower ring; and
a bias electrode adjacent the upper and lower rings,
wherein the lower ring includes:
a ring base having constant thickness and configured to support an edge of a bottom surface of the substrate; and
a protrusion extending upwardly from an edge of the ring base to surround a lower portion of a sidewall of the substrate,
wherein the protrusion has an inner diameter greater than an outer diameter of the upper ring,
wherein the protrusion has a height of 745 μm to 772 μm from a top surface of the ring base,
wherein the bias electrode comprises a lower electrode and an upper electrode, and
wherein an upper surface of the lower electrode is below and spaced apart from the lower ring and a lower surface of the upper electrode is above and spaced apart from the lower electrode and the upper ring.

11. The bevel etching apparatus of claim 10, further comprising a bias power supply that is connected to the lower electrode and is configured to supply the lower electrode with a bias power.

12. The bevel etching apparatus of claim 10, wherein the chuck plate includes:
a chuck base; and
a dielectric layer on the chuck base.

13. The bevel etching apparatus of claim 12, further comprising a source power supply that is connected to the chuck base and is configured to supply the chuck base with a source power.

14. A bevel etching apparatus, comprising:
a chuck plate configured to receive a substrate;
a lower ring surrounding a circumference of the chuck plate;
a cover plate on the chuck plate; and
an upper ring surrounding a circumference of the cover plate,
wherein the lower ring includes:
a ring base having constant thickness and configured to support an edge of a bottom surface of the substrate; and
a protrusion extending upwardly from an edge of the ring base to surround a lower portion of a sidewall of the substrate,
wherein the protrusion has an inner diameter greater than an outer diameter of the upper ring,
wherein the bevel etching apparatus further comprises a bias electrode comprising a lower electrode and an upper electrode,
wherein an upper surface of the lower electrode is below and spaced apart from the lower ring, and
wherein a lower surface of the upper electrode is above and spaced apart from the lower electrode and the upper ring.

15. The bevel etching apparatus of claim 14, wherein the ring base comprises planar top and bottom surfaces.

* * * * *